United States Patent
Sutioso et al.

(10) Patent No.: US 8,681,914 B2
(45) Date of Patent: *Mar. 25, 2014

(54) CLOCK OFFSET COMPENSATOR

(75) Inventors: Henri Sutioso, San Jose, CA (US); Lei Wu, Sunnyvale, CA (US)

(73) Assignee: Marvell World Trade Ltd., Hamilton (BM)

( * ) Notice: Subject to any disclaimer, the term of this patent is extended or adjusted under 35 U.S.C. 154(b) by 1056 days.

This patent is subject to a terminal disclaimer.

(21) Appl. No.: 11/895,974

(22) Filed: Aug. 28, 2007

(65) Prior Publication Data

US 2007/0297553 A1 Dec. 27, 2007

Related U.S. Application Data

(63) Continuation of application No. 10/267,177, filed on Oct. 9, 2002, now Pat. No. 7,263,153.

(51) Int. Cl.
*H04L 7/00* (2006.01)
*H04L 27/18* (2006.01)
*H03D 3/24* (2006.01)

(52) U.S. Cl.
USPC .............................. 375/358; 375/326; 375/327

(58) Field of Classification Search
USPC ......... 375/373, 232, 377, 144, 219–222, 268, 375/271, 326, 327, 356, 358, 362, 371, 375/376; 370/286; 327/144–147, 155, 156
See application file for complete search history.

(56) References Cited

U.S. PATENT DOCUMENTS

| | | |
|---|---|---|
| 4,456,965 A | 6/1984 | Graber et al. |
| 4,747,047 A | 5/1988 | Coogan et al. |
| 5,210,855 A | 5/1993 | Bartol |
| 5,220,275 A | 6/1993 | Holmqvist |
| 5,222,062 A | 6/1993 | Sharma et al. |
| 5,274,665 A | 12/1993 | Schilling ........................ 375/144 |
| 5,331,646 A | 7/1994 | Krueger et al. |
| 5,446,767 A | 8/1995 | Nakagawa et al. ........... 375/376 |
| 5,471,152 A | 11/1995 | Gheewala et al. |
| 5,471,585 A | 11/1995 | Barakat et al. |
| 5,553,230 A | 9/1996 | Petersen et al. |
| 5,564,114 A | 10/1996 | Popat et al. |
| 5,661,765 A * | 8/1997 | Ishizu ........................... 375/376 |

(Continued)

FOREIGN PATENT DOCUMENTS

| | | | |
|---|---|---|---|
| EP | 0876016 A1 | 11/1998 | ................ H04J 3/06 |
| GB | 2 408 624 A | 3/2004 | |

OTHER PUBLICATIONS

Serial ATA II; Extensions to Serial ATA, 1.0, Revision 1.0, Oct. 16, 2002, APT Technologies, Inc., Dell Computer Corporation, Intel Corporation, Maxtor Corporation, Seagate Technology.
RAID Anatomy 101; Alan Benway; Oct. 2000; 7 pages.

(Continued)

*Primary Examiner* — Young T. Tse (57) ABSTRACT

A device comprises a transmitter, a receiver and a clock generator that generates a clock signal having a local clock phase. A clock recovery circuit communicates with the receiver and recovers a host clock frequency from data received from a host by the receiver. A frequency offset circuit communicates with the clock recovery circuit and the clock generator and generates a frequency offset based on the local clock phase and the recovered host clock frequency. A frequency compensator compensates a frequency of the transmitter using the frequency offset.

25 Claims, 8 Drawing Sheets

(56) References Cited

U.S. PATENT DOCUMENTS

| | | |
|---|---|---|
| 5,748,645 A | 5/1998 | Hunter et al. |
| 5,783,960 A | 7/1998 | Lackey |
| 5,787,112 A * | 7/1998 | Murai ............ 375/148 |
| 5,787,485 A | 7/1998 | Fitzgerald et al. |
| 5,802,318 A | 9/1998 | Murray et al. |
| 5,812,754 A | 9/1998 | Lui et al. |
| 5,826,048 A | 10/1998 | Dempsey et al. |
| 5,828,854 A | 10/1998 | Wade |
| 5,848,278 A | 12/1998 | Sakai |
| 5,854,941 A | 12/1998 | Ballard et al. |
| 5,886,901 A | 3/1999 | Magoshi |
| 5,894,560 A | 4/1999 | Carmichael et al. |
| 5,909,451 A | 6/1999 | Lach et al. |
| 6,009,275 A | 12/1999 | DeKoning et al. |
| 6,021,462 A | 2/2000 | Minow et al. |
| 6,038,267 A * | 3/2000 | Oura et al. ............ 375/329 |
| 6,057,863 A | 5/2000 | Olarig |
| 6,059,836 A | 5/2000 | Liguori |
| 6,073,188 A | 6/2000 | Fleming |
| 6,092,169 A | 7/2000 | Murthy et al. |
| 6,106,568 A | 8/2000 | Beausang et al. |
| 6,178,215 B1 | 1/2001 | Zhang et al. ............ 375/371 |
| 6,223,238 B1 | 4/2001 | Meyer et al. |
| 6,237,052 B1 | 5/2001 | Stolowitz |
| 6,314,145 B1 | 11/2001 | VanDriest ............ 375/326 |
| 6,330,687 B1 | 12/2001 | Griffith et al. |
| 6,363,439 B1 | 3/2002 | Battles et al. |
| 6,367,033 B1 | 4/2002 | Jibbe |
| 6,378,039 B1 | 4/2002 | Obara et al. |
| 6,442,722 B1 | 8/2002 | Nadeau-Dosic |
| 6,447,340 B1 | 9/2002 | Wu |
| 6,484,294 B1 | 11/2002 | Kiyoshige et al. |
| 6,496,900 B1 | 12/2002 | McDonald et al. |
| 6,549,981 B2 | 4/2003 | McDonald et al. |
| 6,557,065 B1 | 4/2003 | Peleg et al. |
| 6,564,271 B2 | 5/2003 | Micalizzi, Jr. et al. |
| 6,578,126 B1 | 6/2003 | MacLellan et al. |
| 6,614,842 B1 | 9/2003 | Chou et al. ............ 375/232 |
| 6,662,076 B1 | 12/2003 | Conboy et al. |
| 6,678,768 B1 | 1/2004 | Craft |
| 6,687,775 B1 | 2/2004 | Basset |
| 6,697,867 B1 | 2/2004 | Chong, Jr. |
| 6,704,300 B1 | 3/2004 | Chen et al. ............ 370/350 |
| 6,791,779 B1 | 9/2004 | Singh et al. ............ 360/55 |
| 6,792,494 B2 | 9/2004 | Bennett et al. |
| 6,813,688 B2 | 11/2004 | Wu et al. |
| 6,845,420 B2 | 1/2005 | Resnick |
| 6,854,045 B2 | 2/2005 | Ooi et al. |
| 6,898,655 B1 | 5/2005 | Sutardja |
| 6,908,330 B2 | 6/2005 | Garrett et al. |
| 6,915,380 B2 | 7/2005 | Tanaka et al. |
| 6,917,992 B2 | 7/2005 | Grimsrud et al. |
| 6,922,738 B2 | 7/2005 | Drescher et al. |
| 6,928,509 B2 | 8/2005 | Surugucchi |
| 6,961,813 B2 | 11/2005 | Grieff et al. |
| 6,978,337 B1 | 12/2005 | Chang |
| 7,089,345 B1 | 8/2006 | Lynn |
| 2002/0159311 A1 | 10/2002 | Coffey et al. |
| 2002/0186706 A1 | 12/2002 | Chren et al. |
| 2003/0005231 A1 | 1/2003 | Ooi et al. |
| 2003/0035504 A1 | 2/2003 | Wong et al. ............ 375/377 |
| 2003/0074515 A1 | 4/2003 | Resnick |
| 2003/0135577 A1 | 7/2003 | Weber et al. |
| 2003/0145264 A1 | 7/2003 | Siegel et al. |
| 2003/0167367 A1 | 9/2003 | Kaushik et al. |
| 2003/0236952 A1 | 12/2003 | Grieff et al. |
| 2004/0015637 A1 | 1/2004 | Yau |
| 2004/0024950 A1 | 2/2004 | Surugucchi |
| 2004/0044802 A1 | 3/2004 | Chiang et al. |
| 2004/0068591 A1 | 4/2004 | Workman et al. |
| 2004/0081179 A1 | 4/2004 | Gregorcyk |
| 2004/0083323 A1 | 4/2004 | Rabinovitz et al. |
| 2004/0083324 A1 | 4/2004 | Rabinovitz et al. |
| 2004/0088441 A1 | 5/2004 | Chiang et al. |
| 2004/0100944 A1 | 5/2004 | Richmond et al. |
| 2004/0113662 A1 | 6/2004 | Grimsrud |
| 2004/0117522 A1 | 6/2004 | Loffink et al. |
| 2004/0120353 A1 | 6/2004 | Kim et al. |
| 2004/0198104 A1 | 10/2004 | Hadba et al. |
| 2004/0199515 A1 | 10/2004 | Penny et al. |
| 2004/0203295 A1 | 10/2004 | Hadba et al. |
| 2004/0205288 A1 | 10/2004 | Ghaffari et al. |
| 2004/0252716 A1 | 12/2004 | Nemazie |
| 2004/0264284 A1 | 12/2004 | Priborsky et al. |
| 2005/0005216 A1 | 1/2005 | Chameshlu et al. |
| 2005/0015655 A1 | 1/2005 | Clayton et al. |
| 2005/0024083 A1 | 2/2005 | Kitzmura et al. |
| 2005/0027894 A1 | 2/2005 | Ayyavu et al. |
| 2005/0055501 A1 | 3/2005 | Guha et al. |
| 2005/0144490 A1 | 6/2005 | Igari |
| 2005/0204078 A1 | 9/2005 | Steinmetz et al. |
| 2005/0246475 A1 | 11/2005 | Ervin |
| 2005/0251588 A1 | 11/2005 | Hoch et al. |
| 2008/0310330 A1 * | 12/2008 | Agazzi et al. ............ 370/286 |

OTHER PUBLICATIONS

Taking a Ride on the Bus; Alan Benway; Apr. 2000; 5 pages.
Serial ATA Next Generation Storage Interface; Mark Kymin; Jun. 9, 2005; pp. 1-6.
SATA PHY Interface Specification (SAPIS) Draft—Rev 0.90; Intel Corporation; Feb. 8, 2002; pp. 1-12.
SATA Technology; www.sata-or.org; Dec. 15, 2004; 8 pages.
SATA v PATA; Sanjeeb Nanda, Computer Technology Review; Nov. 2002; p. 18.
SATA (FAQs); Seagate Technology LLC; 2005; 3 pages.
Serial ATA: High Speed Serialized AT Attachment; Revision 1.0a; Jan. 7, 2003; APT Technologies, Inc., Dell Computer Corporation, Intel Corporation, Maxtor Corporation, Seagate Technology; 311 pages.
Serial ATA-to-Ultra ATA Adapter; SIIG, Inc.; 2 pages.
Tempo Bridge G5 Serial ATA Interface to Parallel ATA Drive Adapter; Sonnet Technologies, Inc., Revised 2005; 3 pages.
Serial ATA in Servers and Networked Storage; 2002; 12 pages.
Serial ATA II: Port Multiplier, Revision 1.0, Mar. 25, 2003, APT Technologies, Inc., Dell Computer Corporation, Intel Corporation, Maxtor Corporation, Seagate Technology; 34 pages.
Serial ATA II Workgroup; Serial ATA II Specification Port Selector, Proposed Draft; Revision 1.0RC, Jun. 23, 2003; 21 pages.
Information Technology—AT Attachment with Packet Interface—6 (ATA/ATAPI-6), Working Draft, T13 1410D, Revision 3; Peter T. McLean; Oct. 30, 2001; 496 pages.
Serial ATA II: Port Selector, Revision 1.0, Jul. 28, 2003; Dell Computer Corporation, Intel Corporation, Maxtor Corporation, Seagate Technology, Vitesse Semiconductor Corporation; 20 pages.
"Serial ATA: High Speed Serialized AT Attachment", Serial ATA Organization, Revision 1.0, Aug. 29, 2001.
Supplements to "Serial ATA: High Speed Serialized AT Attachment", Serial ATA Organization, Revision 1.0, Aug. 29, 2001.
Errata to "Serial ATA: High Speed Serialized AT Attachment", Serial ATA Organization, Revision 1.0, Aug. 29, 2001.
Spread Spectrum Scene; http://sss-mag.com/ss.html#tutorial; Mar. 27, 2007; pp. 1-6.
For U.S. Appl. No. 10/267,177, filed Oct. 9, 2002, Office Action dated Dec. 13, 2006.
For U.S. Appl. No. 10/267,177, filed Oct. 9, 2002, Office Action dated Jul. 10, 2006.
For U.S. Appl. No. 10/267,177, filed Oct. 9, 2002, Office Action dated Feb. 8, 2006.
Authoritative Dictionary; pp. 123-124.
Serial ATA-to-Ultra ATA Adapter; SIIG, Inc., 2005; 2 pages.
Serial ATA-to-Ultra ATA Adapter; SIIG, Inc.; 2005; 2 pages.

* cited by examiner

FIG. 11

CLOCK OFFSET COMPENSATOR

CROSS-REFERENCE TO RELATED APPLICATIONS

This application is a continuation of U.S. patent application Ser. No. 10/267,177 filed on Oct. 9, 2002. The disclosure of the above application is incorporated herein by reference.

FIELD OF THE INVENTION

The present invention relates to clock compensation, and more particularly to compensating a local clock of a device that receives data from a host for frequency offset when transmitting data from the device to the host.

BACKGROUND OF THE INVENTION

A host and a device typically transmit and receive data to and from each other. For example in a personal computer environment, a disk drive controller (host) is often connected to a disk drive (device). The host is typically implemented using a relatively accurate host clock generator. The accuracy is often required to meet the specifications of a host processor and/or other host components.

The host and the device may be connected using a Serial Advanced Technology Attachment (SATA) standard, although other protocols may be used. The SATA standard is a simplified standard for transferring data in a packet switching network between a host and a device. SATA typically employs balanced voltage (differential) amplifiers and two pairs of wires to connect transmitters and receivers of the host and the device in a manner similar to 100BASE-TX Ethernet. The SATA standard is disclosed in "Serial ATA: High Speed Serialized AT Attachment", Serial ATA Organization, Revision 1.0, 29 Aug. 2001, and its Supplements and Errata, which are hereby incorporated by reference.

To reduce costs, the device may be implemented using a less accurate clock. For example, the device may include a resonator, which may be crystal or ceramic based. The resonator generates a reference clock for a frequency synthesizer of a phase-locked loop (PLL), which generates a higher-frequency clock. Ceramic resonators are cheaper than crystal resonators but not as accurate. The resonator can be an individual component. Alternately, the resonator can be implemented inside a clock chip (such as crystal voltage controlled oscillator (VCO)).

When the device is implemented using lower accuracy clock generators, the transmitted data from the device to the host may not meet data transmission standards, such as SATA or other standards. As a result, the device must be implemented with a more expensive local clock generator with improved accuracy, which increases the cost of the device.

SUMMARY OF THE INVENTION

A device according to the present invention communicates with a host and includes a transmitter, a receiver and a clock generator that generates a local clock frequency. A clock recovery circuit communicates with the receiver and recovers a host clock frequency from data received from the host by the receiver. A frequency offset circuit communicates with the clock recovery circuit and the clock generator and generates a frequency offset based on the clock frequency and the recovered host clock frequency. A frequency compensator compensates a frequency of the transmitter using the frequency offset.

In other features, the frequency compensator includes a low pass filter that communicates with the frequency offset circuit. The frequency compensator includes an accumulator that communicates with the low pass filter and that generates a phase offset. The frequency compensator includes an interpolator that receives a local phase from the clock generator and the phase offset from the accumulator. The interpolator outputs a compensated clock signal to the transmitter.

In yet other features, the clock generator includes a phase-locked loop circuit that includes a reference frequency generator, a phase detector that communicates with the reference frequency generator, a low pass filter that communicates with the phase detector, and a voltage controlled oscillator that communicates with the low pass filter. The reference frequency generator includes at least one of a crystal resonator and a ceramic resonator.

In still other features, a 1/N divider has an input that communicates with the voltage controlled oscillator and an output that communicates with the phase detector. A 1/M divider has an input that communicates with the reference frequency generator and an output that communicates with the phase detector. N and M are adjusted to create a spread spectrum modulation signal for spread spectrum operation. An interpolator communicates with an output of the voltage controlled oscillator and an input of the 1/N divider for smoothing.

In still other features, a summer has a first input that communicates with an output of the low pass filter and an output that communicates with an input of the accumulator. A frequency modulation generator communicates with a second input of the summer and selectively generates a spread spectrum modulation signal when spread spectrum operation is enabled and a constant signal when spread spectrum operation is disabled.

In other features, the host and the device communicate using a serial ATA standard. The host can be a disk controller and the device can be a disk drive.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses. For purposes of clarity, the same reference numbers will be used in the drawings to identify similar elements.

Figure 1:
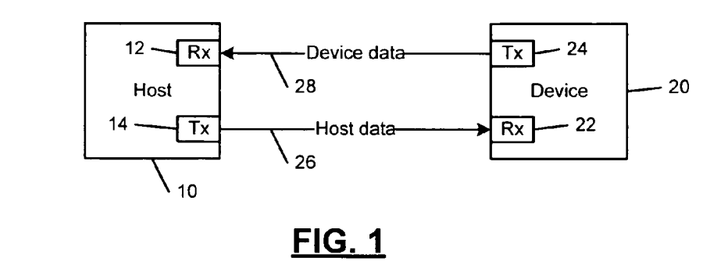
FIG. 1 is a functional block diagram illustrating a host connected to a device.

Referring now to FIG. 1, a host 10 includes a receiver 12 and a transmitter 14. A device 20 includes a receiver 22 and a transmitter 24. The transmitter 14 of the host 10 transmits host data 26 to the receiver 22 of the device 20. The transmitter 24 of the device 20 transmits device data 28 to the receiver 12 of the host 10.

Figure 2:
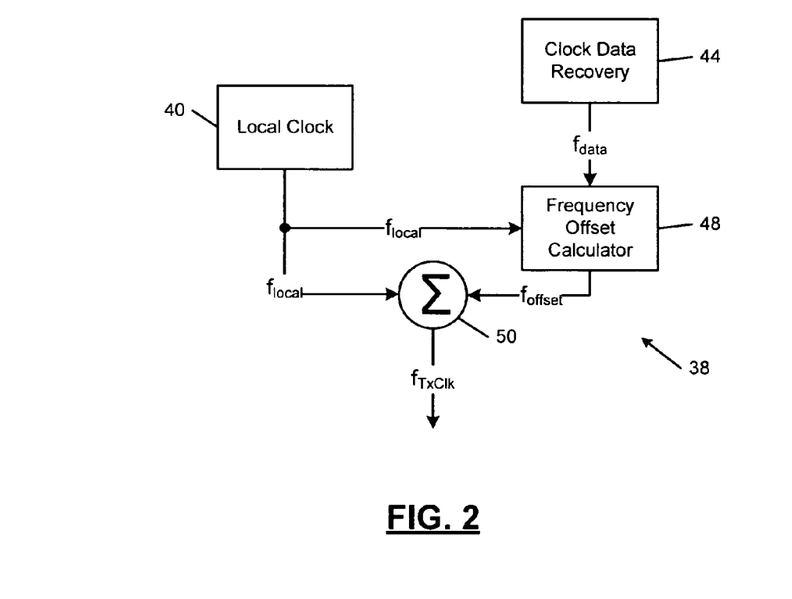
FIG. 2 is a functional block diagram illustrating a frequency offset compensator according to the present invention for a transmitter of the device of FIG. 1.

Referring now to FIG. 2, the device 20 includes a frequency offset compensator generally identified at 38. A local clock generator 40 generates a local clock frequency $f_{local}$. The device 20 also includes a clock data recovery circuit 44 that determines a clock frequency $f_{data}$ of the host 10 from data transmitted by the host 10. A frequency offset calculator 48 compares the host frequency $f_{data}$ to the local frequency $f_{local}$ and generates a frequency offset $f_{offset}$. The $f_{offset}$ is used to compensate $f_{local}$. For example, $f_{offset}$ and $f_{local}$ are summed by a summer 50. The compensated frequency is used to clock the transmitter 24 of the device 20. By compensating the frequency of the transmitter 24 of the device 20, a less expensive local clock generator can be used to reduce the cost of the device 20.

Figure 3:
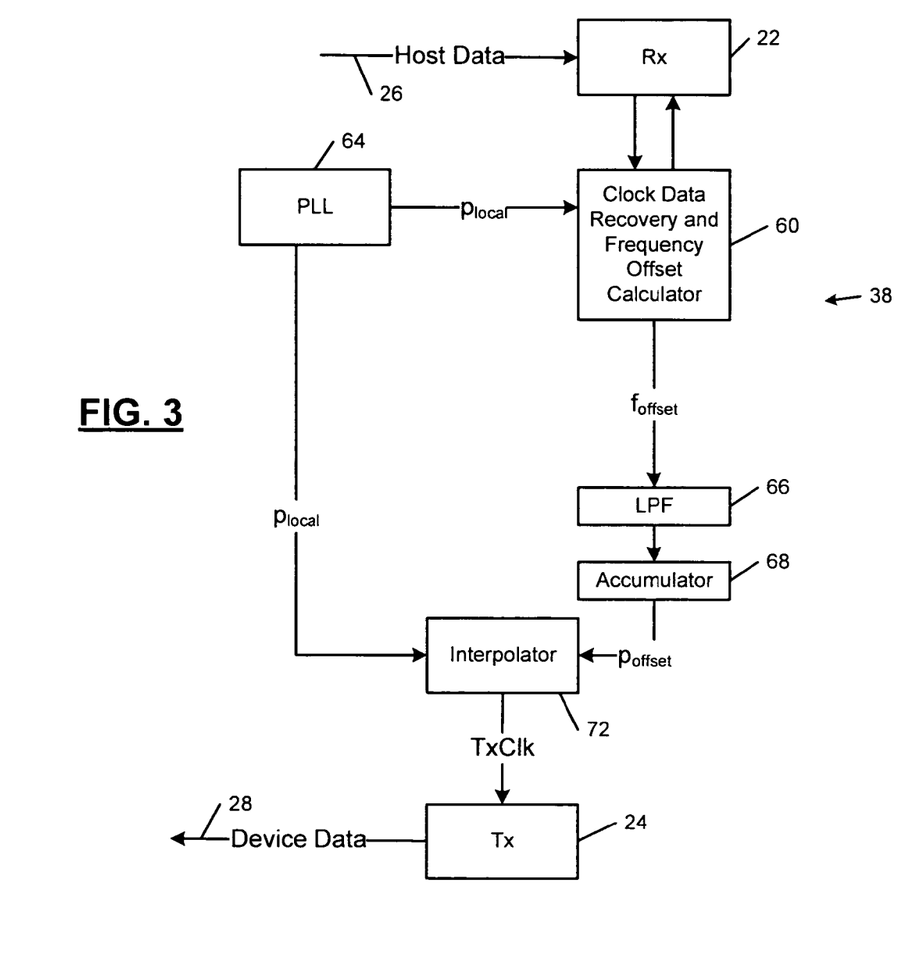
FIG. 3 is a more detailed functional block diagram of a first embodiment of the frequency offset compensator for the transmitter of the device.

Referring now to FIG. 3, the host data 26 is received by the receiver 22 of the device 20. A clock data recovery and frequency offset calculator 60 communicates with the receiver 22. A phase-locked loop (PLL) 64 generates a local phase $p_{local}$, which is output to the clock data recovery and frequency offset calculator 60. The clock data recovery and frequency offset calculator 60 outputs a receiver clock to the receiver 22 and a frequency offset $f_{offset}$ to a low pass filter (LPF) 66, which has an output that is connected to an accumulator 68.

The accumulator 68 generates a phase offset $p_{offset}$, which is input to an interpolator 72. The interpolator 72 also receives $p_{local}$ from the PLL 64. The interpolator 72 generates a compensated clock signal based on $p_{offset}$ and $p_{local}$. An output of the interpolator 72 communicates with the transmitter 24, which transmits the device data 28.

Figure 4:
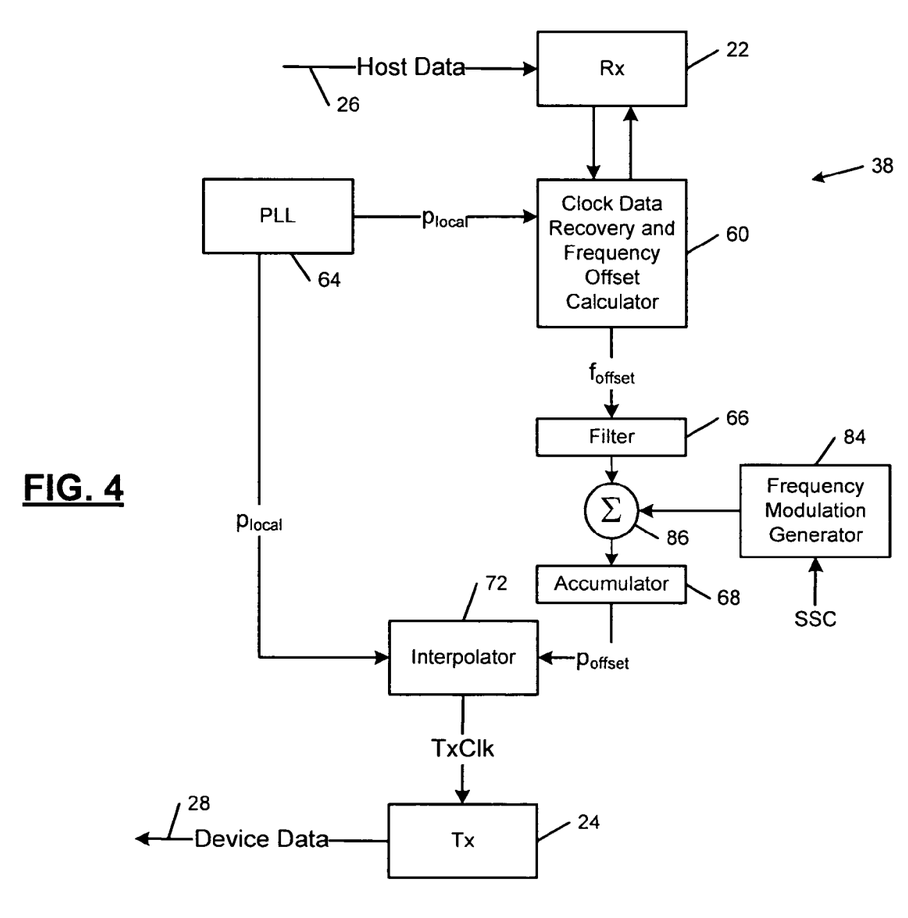
FIG. 4 is a functional block diagram of a second embodiment of a frequency offset compensator for the transmitter of the device and a triangular wave generator for optional spread spectrum operation.

Referring now to FIG. 4, an optional spread spectrum mode of operation may also be provided. A frequency modulator generator 84 selectively generates a constant output and/or a spread spectrum modulation signal based upon a spread spectrum control signal (SSC). For example, the frequency modulation generator 84 can generate a triangular wave, a sine wave or any other spread spectrum modulation signal. An output of the frequency modulation generator 84 is input to a first input of a summer 86. A second input of the summer 86 communicates with an output of the filter 66. An output of the summer 86 communicates with an input of the accumulator 68.

When the spread spectrum control (SSC) is enabled, the output of the filter 66 is summed with the spread spectrum modulation signal to generate the phase offset $p_{offset}$, which is input to the interpolator 72. When spread spectrum control is disabled, the output of the filter 66 is summed with a constant output of the frequency modulation generator 84 to generate the phase offset $p_{offset}$, which is input to the interpolator 72.

Figure 5:
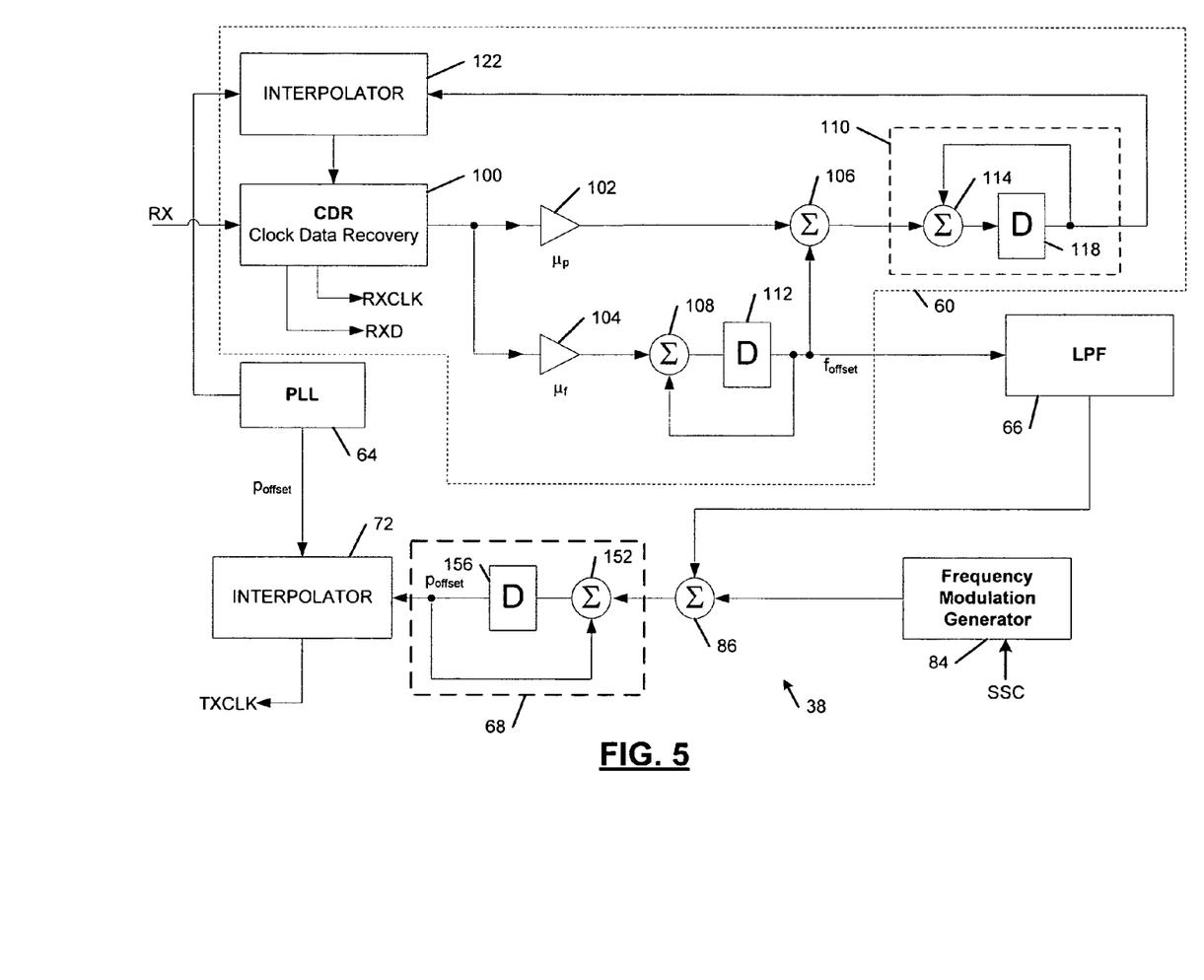
FIG. 5 is an exemplary implementation of the frequency offset compensator of FIGS. 3 and 4.

Referring now to FIG. 5, an exemplary implementation of the frequency offset compensator 38 is shown. The device 20 employs a second order timing recovery circuit. The clock data recovery and frequency offset calculator 60 includes a clock data recovery circuit 100 having an output connected to gain circuits 102 and 104. An output of the gain circuit 102 (phase error) communicates with a first input of a summer 106. An output of the gain circuit 104 (frequency error) communicates with a first input of a summer 108.

An output of the summer 108 communicates with a delay element 112, which has an output connected to a second input of the summer 106 and a second input of the summer 108. The delay elements can be registers. An output of the summer 106 is connected to an accumulator 110 including a summer 114 and a delay element 118. The output of the summer 106 is connected to a first input of the summer 114. An output of the summer 114 is connected to the delay element 118, which has an output connected to a second input of the summer 114 and to a first input of an interpolator 122.

In an exemplary implementation, the interpolator 122 operates using 128-phases at 375 MHz, although higher or lower phases and/or frequencies can be used. A second input of the interpolator 122 is connected to an output of the PLL 64. An output of the interpolator 122 is input to the clock data recovery circuit 100. The clock data recovery and frequency offset calculator 60 outputs the frequency offset $f_{offset}$, which is input to the LPF 66. An output of the LPF 66 is connected to the summer 86.

An output of the frequency modulation generator 84 is connected to a second input of the summer 86. An output of the summer 86 is connected to a first input of a summer 152 in the accumulator 68. An output of the summer 152 is connected to a delay element 156, which has an output that is connected to the interpolator 72 and to a second input of the summer 152. The interpolator 72 operates using 128-phases at 750 MHz, although higher or lower phases and/or frequencies can be used.

Figure 6:
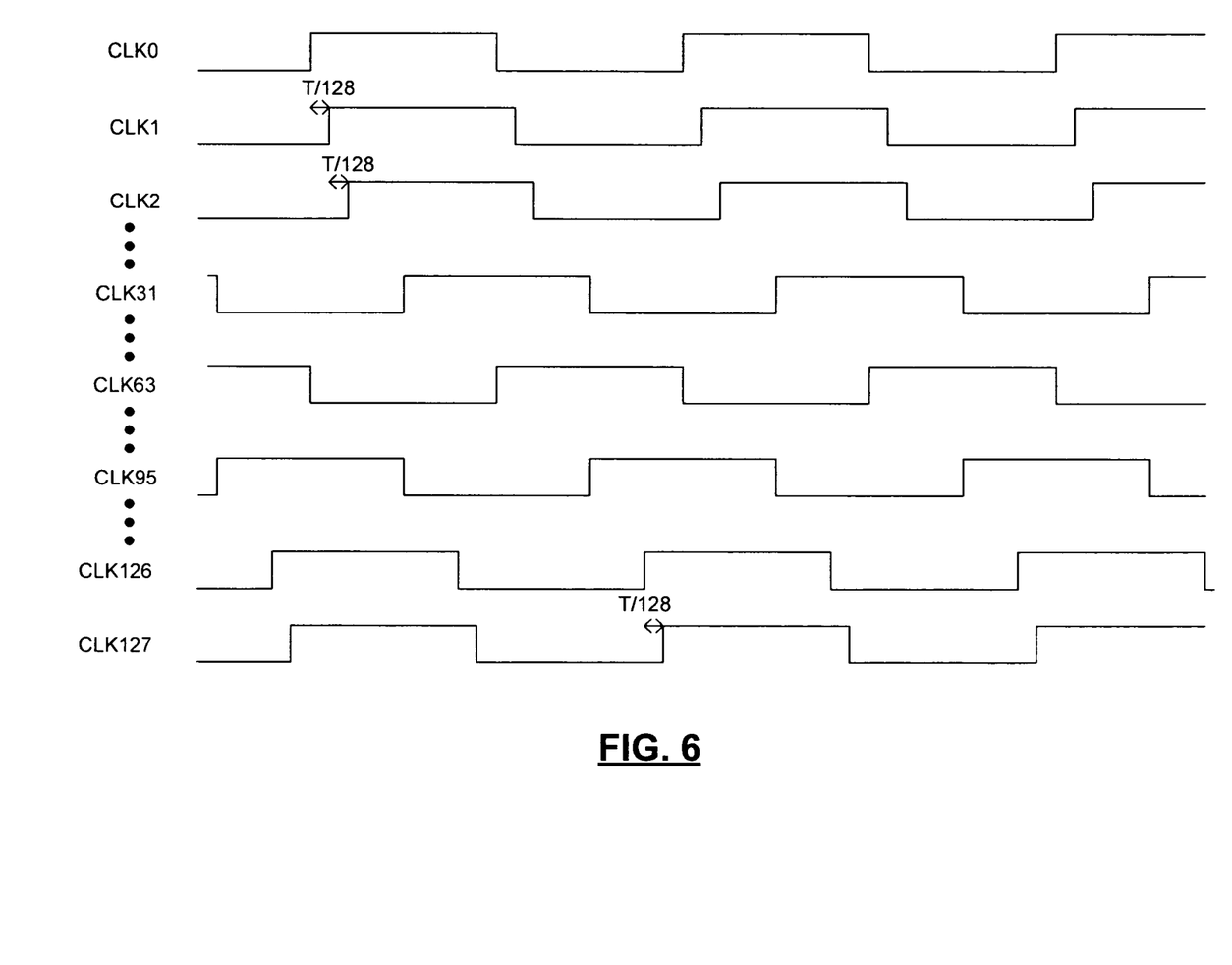
FIG. 6 illustrates clock timing for an exemplary interpolator shown in FIGS. 3-5.

Referring now to FIG. 6, operation of the interpolators is illustrated briefly. The interpolators divide a clock frequency into multiple phases. For example, the interpolator 72 divides a clock frequency into 128 phases. Interpolation and frequency adjustment is performed by jumping the phase forward or backward. For example, CLK0 is T/128 before CLK1. CLK3 is 2T/128 after CLK0. CLK0 is 5T/128 before CLK6.

Figure 7:
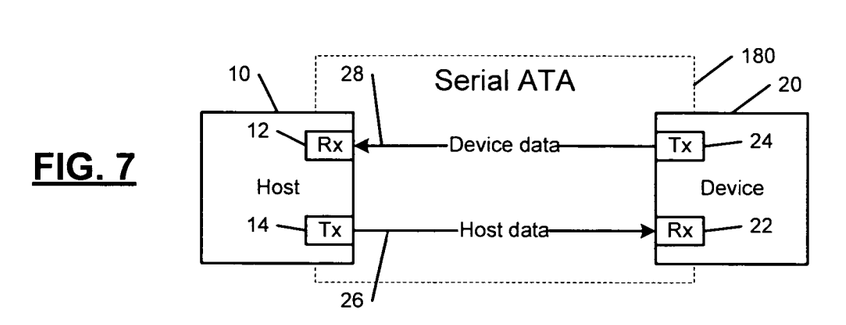
FIG. 7 illustrates the host and the device of FIG. 1 with a connection based on the SATA standard.
Figure 8:
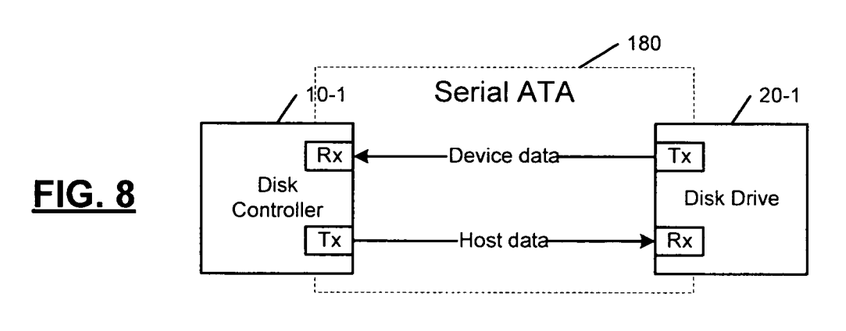
FIG. 8 illustrates a disk controller and a disk drive with a connection based on the SATA standard.

Referring now to FIG. 7, the host 10 and the device 20 may be connected by a serial ATA medium 180. Referring now to FIG. 8, the host 10 can be a disk controller 10-1 and the device 20 can be a disk drive 20-1. Still other hosts, devices and connection standards can be employed.

Figure 9:
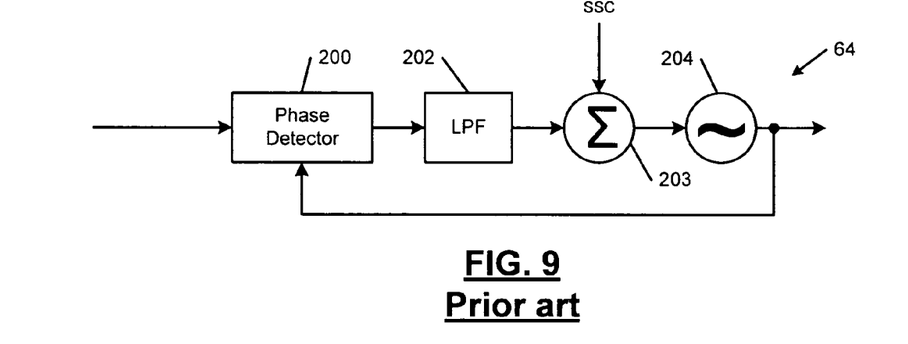
FIGS. 9 and 10 illustrate phase-locked loop (PLL) circuits according to the prior art.
Figure 10:
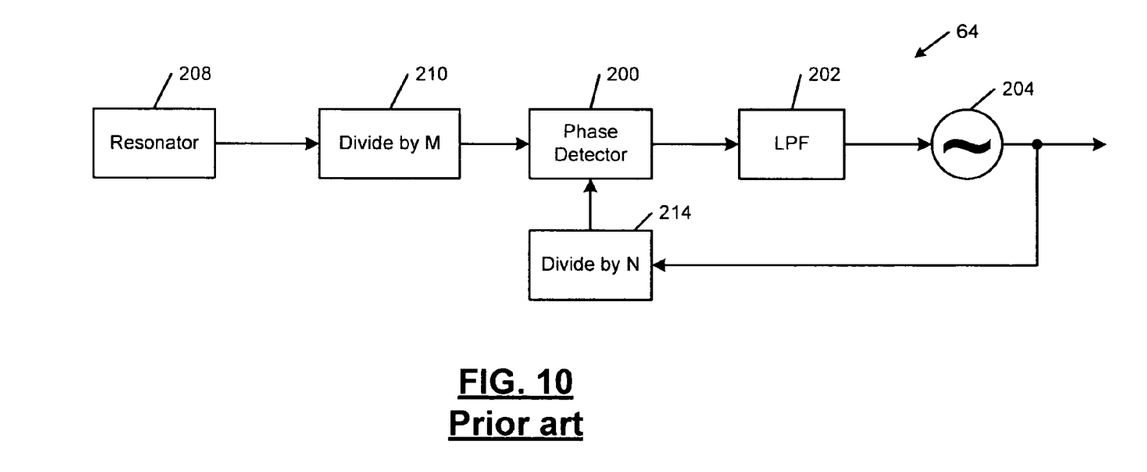
Figure 11:
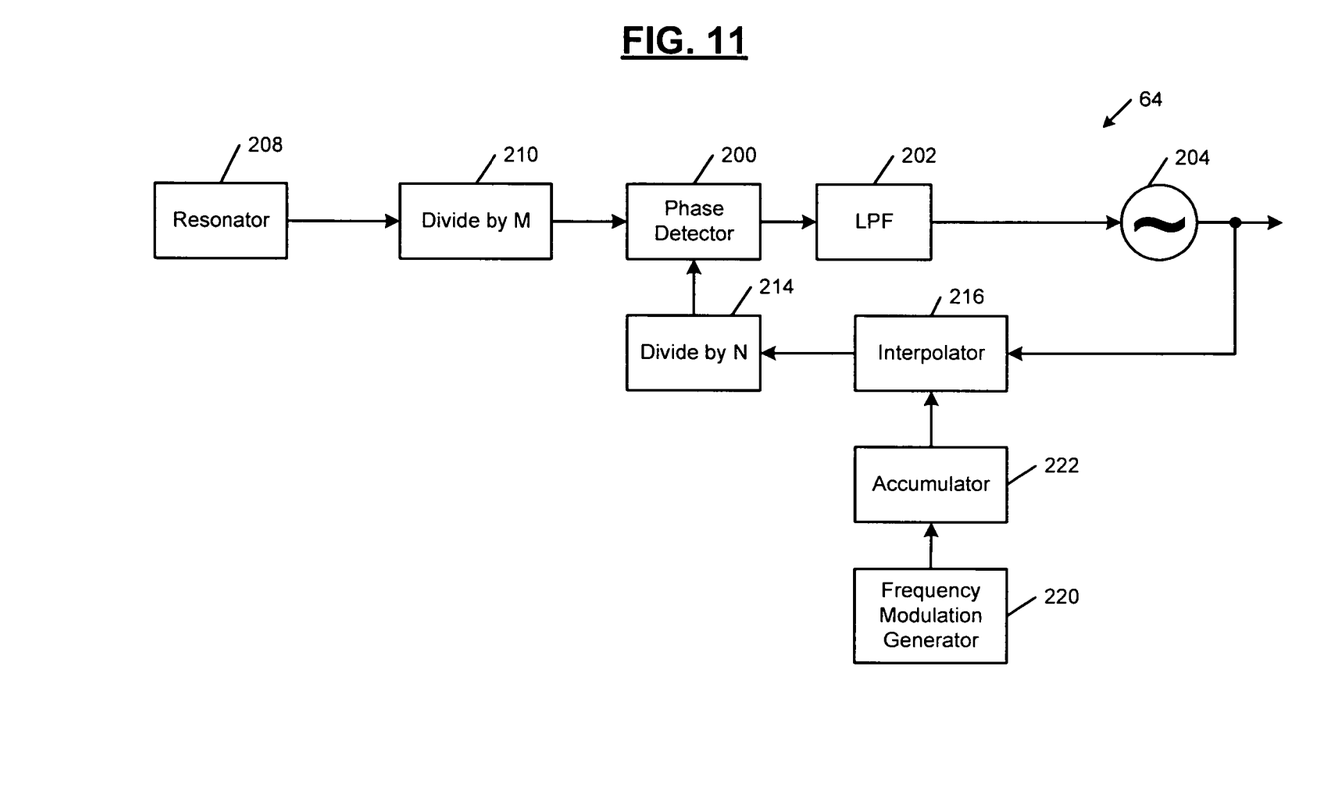
FIG. 11 illustrates a closed loop PLL for spread spectrum operation according to the present invention.

Referring now to FIGS. 9-11, several exemplary implementations of the PLL 64 are shown. In FIG. 9, the PLL 64 includes a phase detector 200 having an input connected to a reference frequency. An output of the phase detector 200 is input to a low pass filter 202, which has an output that is connected to a first input of a summer 203. A spread spectrum control (SSC) signal is input to a second input of the summer 203. An output of the summer is input to a voltage controlled oscillator (VCO) 204, which has an output that is fed back to the phase detector 200. In FIG. 10, the PLL 64 supports open-loop spread spectrum operation. The reference frequency is input from a resonator 208 to a divide by M circuit

210. The output of the VCO 204 is fed back through a divide by N circuit 214. M and N are modulated to generate a triangular wave.

In FIG. 11, the PLL 64 supports closed loop spread spectrum operation. The reference frequency is input to the divide by M circuit 210. The output of the VCO 204 is fed back to a first input of an interpolator 216. A frequency modulation generator 220 outputs a spread spectrum modulation signal, such as a triangular wave, sine wave, etc., to an accumulator 222. An output of the accumulator 220 is input to a second input of the interpolator 216. M and N are modulated to generate a triangular wave. The interpolator 216 provides smoothing. The reference frequency for the PLL 64 may be generated by the resonator 208 although other reference frequency generators can be used.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A device comprising:
    a receiver configured to receive data from a host;
    a clock generator configured to generate a clock signal having a local clock phase;
    a clock recovery circuit in communication with the receiver, wherein the clock recovery circuit is configured to recover a host clock frequency from the data received by the receiver from the host;
    a frequency offset circuit in communication with each of the clock recovery circuit and the clock generator, wherein the frequency offset circuit is configured to generate a frequency offset based on the local clock phase and the host clock frequency recovered by the clock recovery circuit; and
    a frequency compensator configured to
    i) generate a spread spectrum modulation signal when spread spectrum operation is enabled,
    ii) generate a constant signal when the spread spectrum operation is disabled, and
    iii) compensate a frequency of a transmitter using the frequency offset and a selected one of the spread spectrum modulation signal and the constant signal, wherein the device is configured to transmit data back to the host based on the compensated frequency.

2. The device of claim 1, wherein the frequency compensator includes a low pass filter in communication with the frequency offset circuit.

3. The device of claim 2, wherein the frequency compensator further includes an accumulator in communication with the low pass filter, wherein the accumulator is configured to generate a phase offset.

4. The device of claim 3, wherein the frequency compensator further includes an interpolator configured to i) receive the local clock phase from the clock generator and the phase offset from the accumulator and ii) output a compensated clock signal to the transmitter.

5. The device of claim 1, wherein the clock generator includes a phase-locked loop circuit that includes:
    a reference frequency generator;
    a phase detector in communication with the reference frequency generator;
    a low pass filter in communication with the phase detector; and
    a voltage controlled oscillator in communication with the low pass filter.

6. The device of claim 5, wherein the reference frequency generator comprises a crystal resonator or a ceramic resonator.

7. The device of claim 5, wherein the phase-locked loop circuit further includes:
    a 1/N divider having (i) an input in communication with the voltage controlled oscillator and (ii) an output in communication with the phase detector; and
    a 1/M divider having (i) an input in communication with the reference frequency generator and (ii) an output in communication with the phase detector, wherein N and M are adjusted to create the spread spectrum modulation signal when the spread spectrum operation is enabled.

8. The device of claim 7, wherein the phase-locked loop further includes an interpolator in communication with (i) an output of the voltage controlled oscillator and (ii) an input of the 1/N divider.

9. The device of claim 1, wherein the host and the device are configured to communicate using a serial advanced technology attachment (SATA) standard.

10. The device of claim 1, wherein the host is a disk controller and the device is a disk drive.

11. A communication system, comprising:
    a host including i) a host transmitter, ii) a host receiver, and iii) a host clock generator configured to generate a host clock frequency; and
    a device in communication with the host using a serial advanced technology attachment (SATA) standard, the device including:
    a device transmitter;
    a device receiver;
    a device clock generator configured to generate a clock signal having a local clock phase;
    a clock recovery circuit configured to recover the host clock frequency from data received by the device receiver from the host;
    a frequency offset circuit configured to generate a frequency offset based on the local clock phase and the recovered host clock frequency recovered by the clock recovery circuit; and
    a frequency compensator configured to i) generate a spread spectrum modulation signal when spread spectrum operation is enabled, ii) generate a constant signal when spread spectrum operation is disabled, and iii) compensate a frequency of the device transmitter using the frequency offset and a selected one of the spread spectrum modulation signal and the constant signal, wherein the device is configured to transmit data back to the host based on the compensated frequency.

12. The communication system of claim 11, wherein the frequency compensator includes a low pass filter in communication with the frequency offset circuit.

13. The communication system of claim 12, wherein the frequency compensator further includes an accumulator in communication with the low pass filter, wherein the accumulator is configured to generate a phase offset.

14. The communication system of claim 13, wherein the frequency compensator further includes an interpolator configured to receive i) the local clock phase from the device clock generator and ii) the phase offset from the accumulator.

15. The communication system of claim 11, wherein the device clock generator includes a phase-locked loop circuit that includes:
    a reference frequency generator;

a phase detector in communication with the reference frequency generator;
a low pass filter in communication with the phase detector; and
a voltage controlled oscillator in communication with the low pass filter.

16. The communication system of claim 15, wherein the reference frequency generator comprises a crystal resonator or a ceramic resonator.

17. The communication system of claim 15, wherein the phase-locked loop circuit further includes:
a 1/N divider having an input in communication with the voltage controlled oscillator and an output in communication with the phase detector, and
a 1/M divider having an input in communication with the reference frequency generator and an output in communication with the phase detector, wherein N and M are adjusted to create the spread spectrum modulation signal when the spread spectrum operation is enabled.

18. The communication system of claim 17, wherein the phase-locked loop circuit further includes an interpolator in communication with an output of the voltage controlled oscillator and an input of the 1/N divider.

19. The communication system of claim 11, wherein the host is a disk controller and the device is a disk drive.

20. A method for transmitting/receiving data in a device, the method comprising:
transmitting data to a host;
receiving data from the host;
generating a clock signal having a local clock phase;
recovering a host clock frequency from data received by the device from the host;
generating a frequency offset based on the local clock phase and the recovered host clock frequency;
generating a spread spectrum modulation signal when spread spectrum operation is enabled;
generating a constant signal when the spread spectrum operation is disabled,
compensating a transmitting frequency using the frequency offset and a selected one of the spread spectrum modulation signal and the constant signal; and
transmitting the data back to the host from the device based on the compensated transmitting frequency.

21. The method of claim 20, further comprising low pass filtering the frequency offset.

22. The method of claim 21, further comprising generating a phase offset from the filtered frequency offset.

23. The method of claim 22, further comprising generating a compensated clock signal for transmitting the data to the host based on the local clock phase and the phase offset.

24. The method of claim 20, wherein the local clock phase is generated by a phase-locked loop circuit.

25. The method of claim 24, wherein the phase-locked loop circuit receives a reference frequency generated by at least one of a crystal resonator and a ceramic resonator.

* * * * *